(12) United States Patent
Jones

(10) Patent No.: US 11,005,598 B1
(45) Date of Patent: May 11, 2021

(54) SYSTEM AND METHOD FOR A FORWARD ERROR CORRECTION DECODER WITH ERROR REPORTING

(71) Applicant: XILINX, INC., San Jose, CA (US)

(72) Inventor: Ben J. Jones, Edinburgh (GB)

(73) Assignee: XILINX, INC., San Jose, CA (US)

( * ) Notice: Subject to any disclaimer, the term of this patent is extended or adjusted under 35 U.S.C. 154(b) by 24 days.

(21) Appl. No.: 16/571,781

(22) Filed: Sep. 16, 2019

(51) Int. Cl.
  *H04L 1/00* (2006.01)
  *H03M 13/29* (2006.01)

(52) U.S. Cl.
  CPC ...... *H04L 1/0061* (2013.01); *H03M 13/2906* (2013.01); *H04L 1/0045* (2013.01)

(58) Field of Classification Search
  CPC . H04L 1/0061; H04L 1/0045; H03M 13/2906
  See application file for complete search history.

(56) References Cited

U.S. PATENT DOCUMENTS

| | | | |
|---|---|---|---|
| 2004/0054651 A1* | 3/2004 | Katayama | H03M 13/2906 |
| 2013/0166994 A1* | 6/2013 | Mittelholzer | G06F 11/1032 714/805 |
| 2015/0304293 A1* | 10/2015 | Okamura | H04L 9/3239 726/6 |
| 2016/0112189 A1* | 4/2016 | Tomaru | H04L 9/06 380/268 |
| 2019/0188087 A1* | 6/2019 | Arslan | H03M 13/356 |
| 2020/0081774 A1* | 3/2020 | Kumano | H03M 13/1515 |
| 2020/0106461 A1* | 4/2020 | Graumann | H03M 13/154 |

* cited by examiner

*Primary Examiner* — Guy J Lamarre
(74) *Attorney, Agent, or Firm* — Patterson + Sheridan, LLP (57) ABSTRACT

A forward error correction decoder for packing error information of a codeword in the space that was previously occupied by the parity symbols in the decoder output is presented. Specifically, the decoder summarizes error information of the codeword in a summary vector having the size no greater than the total size of the parity symbols. The decoder then outputs the message symbols from the codeword and the summary error vector, which provides the error information of the received codeword but only requires a bandwidth that is no greater than the bandwidth previously used for transmitting the parity symbols.

20 Claims, 7 Drawing Sheets

SYSTEM AND METHOD FOR A FORWARD ERROR CORRECTION DECODER WITH ERROR REPORTING

TECHNICAL FIELD

Examples of the present disclosure generally relate to integrated circuits ("ICs") and, in particular, to an embodiment related to ICs including a forward error correction (FEC) decoder.

BACKGROUND

Reed-Solomon (RS) codes have been widely used in communications systems as block error-correcting codes. An RS encoder appends a set of parity symbols (also referred to as check symbols) to a fixed block of input symbols to form a codeword for transmission. An RS decoder uses the parity symbols to detect and correct errors in the received codeword. For diagnostic and monitoring use, the RS decoder sometimes provides information on the number of errors that were corrected. Some existing FEC decoders generate an error vector to be provided for analysis. However, the generated error vector has the same size as the codeword itself, and reporting the error vector together with the codeword requires almost twice as much as the output bandwidth of the FEC decoder.

Accordingly, it would be desirable and useful to provide resource-efficient error reporting in an FEC decoder.

SUMMARY

Other aspects and features will be evident from reading the following detailed description and accompanying drawings.

In view of the significant bandwidth consumption issues of error reporting in existing FEC decoders, embodiments described herein provide a circuit including an error vector packing circuit and an output element. The error vector packing circuit is configured to obtain error information indicative of at least one error symbol in a received codeword that includes a set of parity symbols, and generate a summary vector of the error information including an error value and an error location relating to the at least one error symbol. The output element is configured to output the summary vector having a size equal to or less than a total size of the set of parity symbols for generating a decoded codeword corresponding to the received codeword.

In some embodiments, the circuit further includes an error determination circuit configured to receive the codeword that is an error correction block code having a first block of a set of message symbols and a second block of the set of parity symbols, and determine the error information indicative of the at least one error symbol.

In some embodiments, the error determination circuit is configured to determine error information indicative of at least one symbol error in the received codeword based on the set of parity symbols by generating an error vector of a bit pattern having a same size with the received codeword. The error vector, when XORed with the received codeword, produces the corrected codeword.

In some embodiments, the error vector packing circuit is configured to generate the summary vector of the error information by packing the error value from the error information in a first bit pattern having the same size of the message symbol or the parity symbol, and packing an error location from the error information in a second bit pattern having the same size of the parity symbol.

In some embodiments, the error vector packing circuit is configured to pack the error value from the error information in the first bit pattern having the same size of the message symbol or the parity symbol by counting, based on the error information, a first number of bits in the at least one error symbol that changed from 0 to 1, encoding the first number into a first binary number, counting, based on the error information, a second number of bits in the at least one error symbol that changed from 1 to 0, encoding the second number into a second binary number, concatenating the first binary number and the second binary number, and padding the concatenated number with extra bits to the first bit pattern having the same size of the message symbol or the parity symbol.

In some embodiments, the error vector packing circuit is configured to pack the error location from the error information in the second bit pattern having the same size of the message symbol or the parity symbol by designating the second bit pattern indicative of a position of the at least one error symbol in the codeword.

In some embodiments, the error vector packing circuit is configured to generate the summary vector of the error information by concatenating the first bit pattern and the second bit pattern to form a first error block relating to the at least one error symbol.

In some embodiments, the error vector packing circuit is further configured to: in response to determining that the error information is indicative of another error symbol in the received codeword, generate a second error block indicative of another error value and another error location relating to the another error symbol, and concatenate the first error block and the second error block to form the summary vector.

In some embodiments, the circuit further includes a correction circuit configured to generate a corrected codeword by performing an XOR operation on the error information and the received codeword, and sending a set of corrected message symbols from the corrected codeword to the output element. The output element includes a multiplexer configured to multiplex the set of corrected message symbols and the summary vector for output, wherein the output from the multiplexer has an output throughput no greater than an input throughput for receiving the codeword.

In some embodiments, the circuit further includes an alignment circuit coupled to a plurality of parallel receiver circuits. Each receiver circuit is configured to receive data from a communication link, and the alignment circuit is configured to align a plurality of codewords received from multiple communication links into one bitstream and send the one bitstream to the error vector packing circuit.

DETAILED DESCRIPTION

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not to (or needs not to) have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction of the RS decoder is provided. An RS codeword is a block code that usually includes a total number of N symbols, each of which has a number of B bits. The first block of the N symbols includes a number K of message (non-parity) symbols, followed by a second block of N-K parity symbols. An RS code is denoted by RS(N,K), with the symbol size B usually stated in the form of $GF(2^B)$. For example, popular RS codes used for Ethernet implementation include RS(528, 514) on $GF(2^{10})$ and RS(544,514) on $GF(2^{10})$. These codes have 528-514=14 and 544-514=30 parity symbols, respectively, where one symbol equals 10 bits. They can therefore correct 7 symbol errors and 15 symbol errors, respectively.

The construction of the RS code requires that $N<2^B$, and K<N. In general, the value (N-K), which is the number of parity symbols, is even. With the N-K parity symbols, a maximum number T=(N-K)/2 of error symbols may be detected from the RS codeword at the decoder. If a codeword contains more than T symbol errors, the symbol errors are uncorrectable. Generally, when an RS codeword is uncorrectable, the output data from the RS decoder is undefined. The decoder may be configured to output a flag when the error in an RS codeword is uncorrectable.

When the RS decoder generates an error vector having the same size as the RS codeword, the output bandwidth of the RS decoder is doubled in order to output the decoded codeword and the error vector. Thus, some RS decoders provide only a count of the errors corrected for a codeword. In cases where one RS codeword is distributed across multiple communication lanes prior to transmission, symbol errors on each lane need to be counted. To collect this information within the RS decoder, the decoder needs to map the codeword symbols onto the multiple communication lanes that are known to the RS decoder, which may not always be feasible—for example, a new mapping between the codeword symbols and the communication lanes may be implemented after the RS decoder was designed and manufactured, and thus the RS decoder does not have information of the new mapping.

In view of the challenges in error reporting at an RS decoder, embodiments described herein allow the error vector information to be packed into a bandwidth space that is usually occupied by the parity symbols at the RS decoder. In most applications, the parity symbols are immediately discarded after the parity symbols have been used to correct symbol errors in the RS codeword. Thus, the parity symbols do not need to be outputted, and the RS decoder is configured to output corrected message symbols, and the packet error vector information having a size no greater than the original parity symbols. In this way, the error information is provided in-band without incurring further resource requirement at the RS decoder, With the above general understanding borne in mind, various embodiments for providing the RS decoder are described below.

Because one or more of the above-described embodiments and embodiments described throughout the application are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
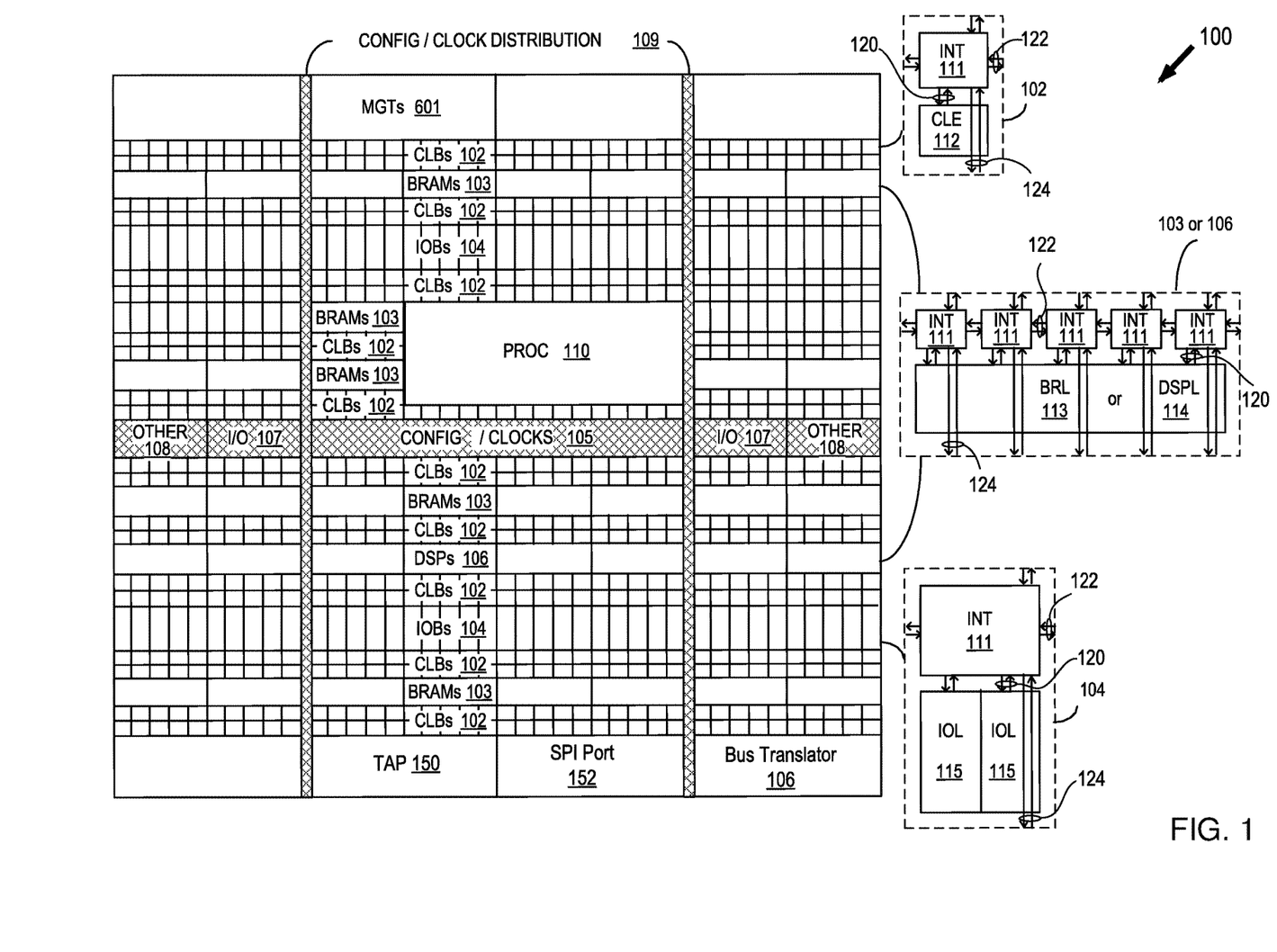
FIG. 1 is intended to illustrate an exemplary architecture that can be used to implement an IC that includes programmable circuitry, e.g., a programmable fabric.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Figure 2A:
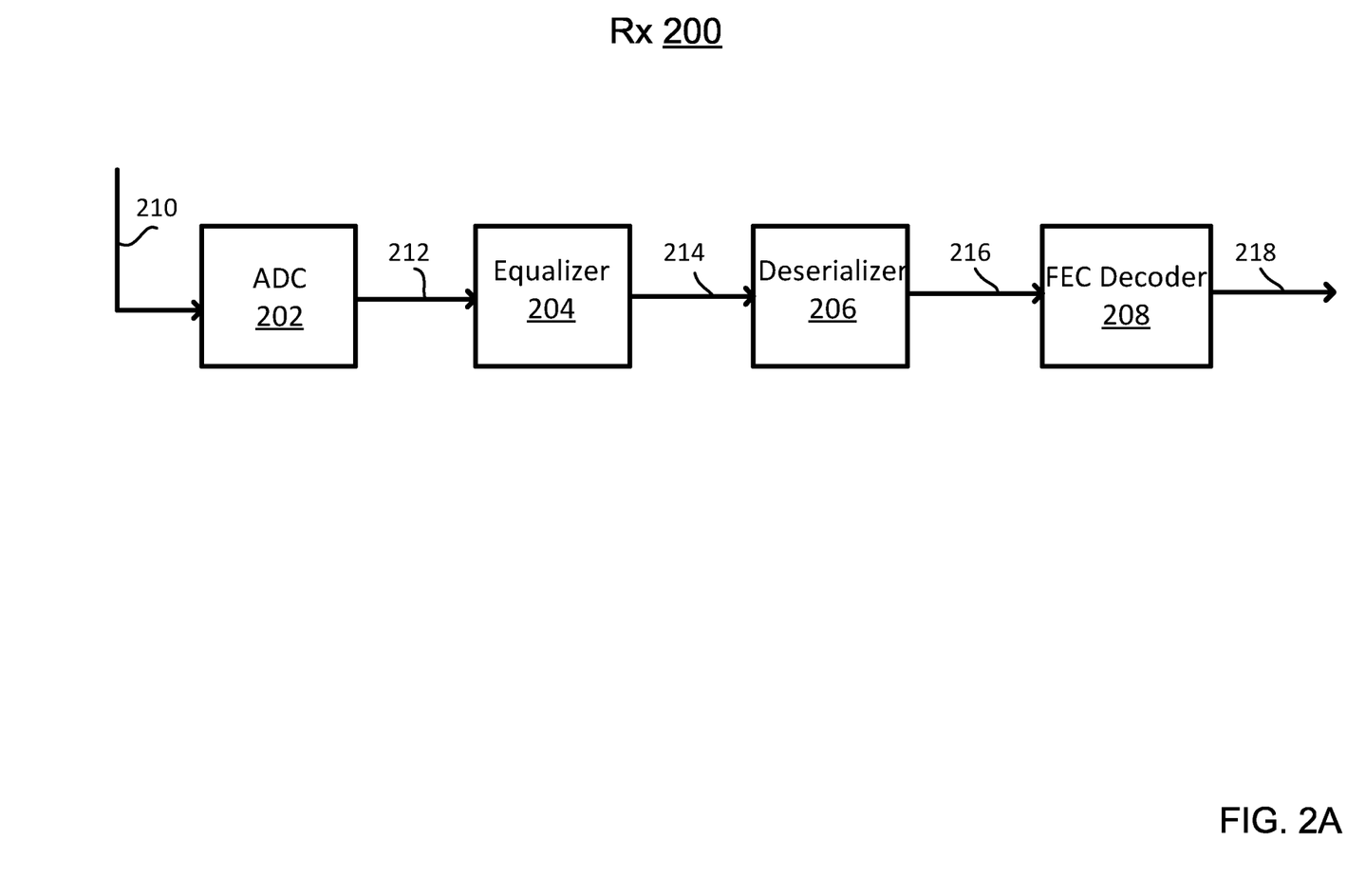
FIG. 2A is a block diagram illustrating an exemplary structure of a receiver containing an FEC decoder which may be implemented on the IC architecture shown in FIG. 1, according to some embodiments of the present disclosure.

FIG. 2A is a block diagram illustrating an exemplary structure of a receiver 200 containing an FEC decoder 208 which may be implemented on the IC architecture 100 shown in FIG. 1, according to some embodiments of the present disclosure. The receiver 200 includes an analog to digital converter (ADC) 202, an equalizer 204, a deserializer 206 and a decoder 208.

It is noted that various signal modulation and demodulation techniques might be employed by the receiver 200. The various signals described herein might employ single-bit or multi-bit data symbols based on various data encoding schemes, such as pulse amplitude modulation (e.g., PAM-4). Further, signal amplitudes might be expressed herein as −1 to 1 such as for Non-Return to Zero (NRZ) signaling, although any signal-encoding scheme might be employed.

In some embodiments, the ADC 202 may receive an analog signal 210, and provides digital conversion of the input analog signal 210. The ADC 202 may sample and digitize the input analog signal 210 based on timing and control of clock and data recovery (CDR) circuitry that is based on a received clock signal based on the timing of the data symbols of the received input analog signal 210. The output 212 of the ADC 202 may include a digital signal of data samples from the input signal 210.

In some embodiments, the equalizer 204 receives the digital signal 212 at its input and performs equalization to the data symbols from the digital signal 212, e.g., to cancel inter-symbol interferences between the data symbols. The equalizer 204 may provide an output 214 to the deserializer 206, which may then deserialize data symbols in the signal 214 to output a codeword 216 in the form of parallel data symbols, for the FEC decoder 208 to generate a decoded codeword and error information 218. As further described in relation to FIGS. 3-5, the FEC decoder 208 is configured to pack error information into a condensed summary vector such that the output 218 of the FEC decoder 208 has a size less than or equal to that of the input codeword 216.

Figure 2B:
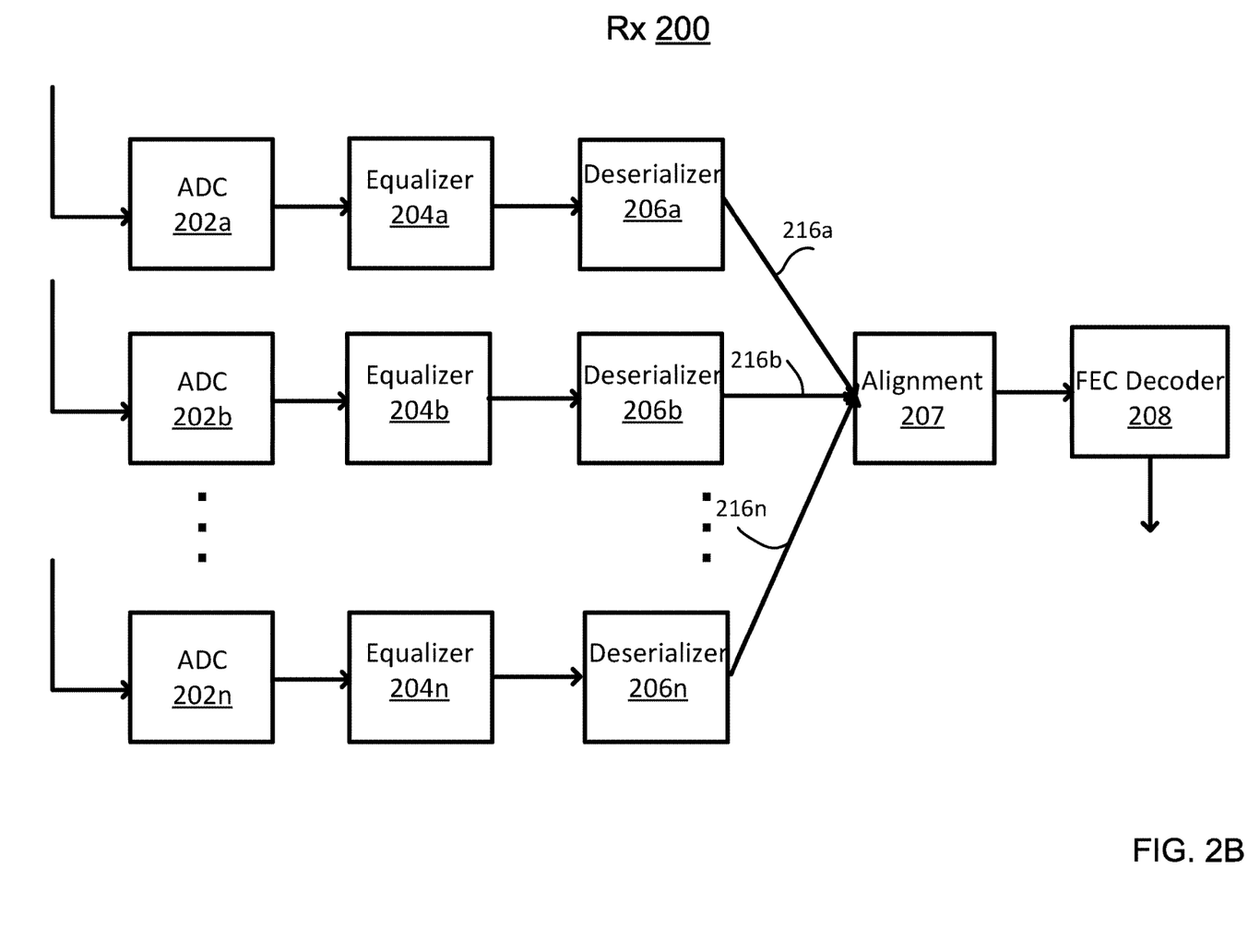
FIG. 2B is a block diagram illustrating an alternative structure of the receiver receiving data symbols from multiple communication lanes, according to some embodiments of the present disclosure.

FIG. 2B is a block diagram illustrating an alternative structure of the receiver receiving data symbols from multiple communication lanes, according to some embodiments of the present disclosure. In some embodiments, the receiver may receive data from multiple communication lanes, e.g., each communication lane is handled by a parallel ADS (202a-n), equalizer (204a-n), deserializer (206a-n). The deserialized data symbols 216a-n are aligned at the alignment module 207 to generate an input of aligned codewords to the FEC decoder 208. Each input aligned codeword from a different communication lane is then passed through the FEC decoder 208, which generates error information for each codeword, as further discussed in relation to FIGS. 3-5. In this way, by aligning codewords from different communication lanes that may have different error rates, the FEC decoder identifies error information for each codeword from a different communication lane separately, regardless of the respective error rate of the specific communication lane.

Figure 3:
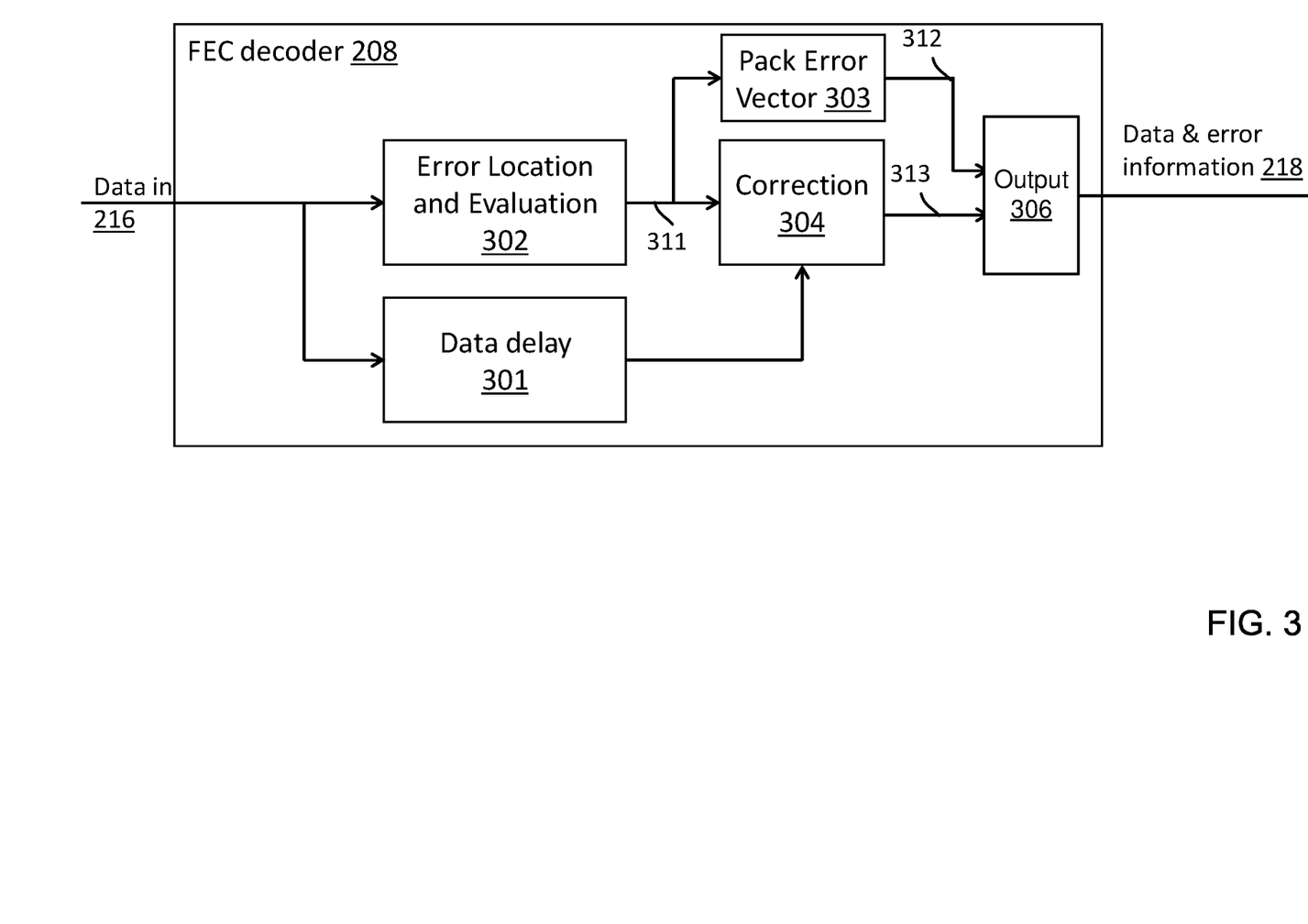
FIG. 3 is a block diagram illustrating an exemplary structure of the FEC decoder that summarizes error information of the received codeword into a condensed error vector, according to some embodiments of the present disclosure.

FIG. 3 is a block diagram illustrating an exemplary structure of the FEC decoder 208 that summarizes error information of the received codeword 216 into a condensed error vector, according to some embodiments of the present disclosure. The FEC decoder 208 receives the input data 216 in the form of a codeword. In some embodiments, the codeword 216 may be an RS(N, K) codeword.

The FEC decoder 208 includes an error location and evaluation circuit 302, which is configured to determine whether each data bit in the RS(N, K) codeword includes an error, based on the (N−K) parity symbols in the codeword. For example, when a data bit in the RS(N, K) codeword is determined to be an error, e.g., either a bit "1" has been flipped to "0" during transmission, or a bit "0" has been flipped to a "1," the error location and evaluation circuit 302 designates a value "1" at the bit location. When the data bit in the RS(N, K) codeword is determined to be correct, the error location and evaluation circuit 302 designates a value "0" at the bit location. In this way, the error location and evaluation circuit 302 generates an error information vector 311 having a number N×B of data bits, each data bit representing whether the data bit in the received RS(N, K) codeword at the respective bit location has an error.

The error vector 311 is then sent to an error vector packing circuit 303, which is configured to condense the error vector 311 of N×B of data bits to a summary vector 312 of no more than (N−K) symbols. Specifically, when an RS codeword is correctable, the codeword contains at most T symbol errors, and the corresponding error vector can therefore be summarized by listing the location (address) of each error symbol and the error value. The error value can be represented by a bit pattern having the same size as a symbol, i.e.

Figure 4A:
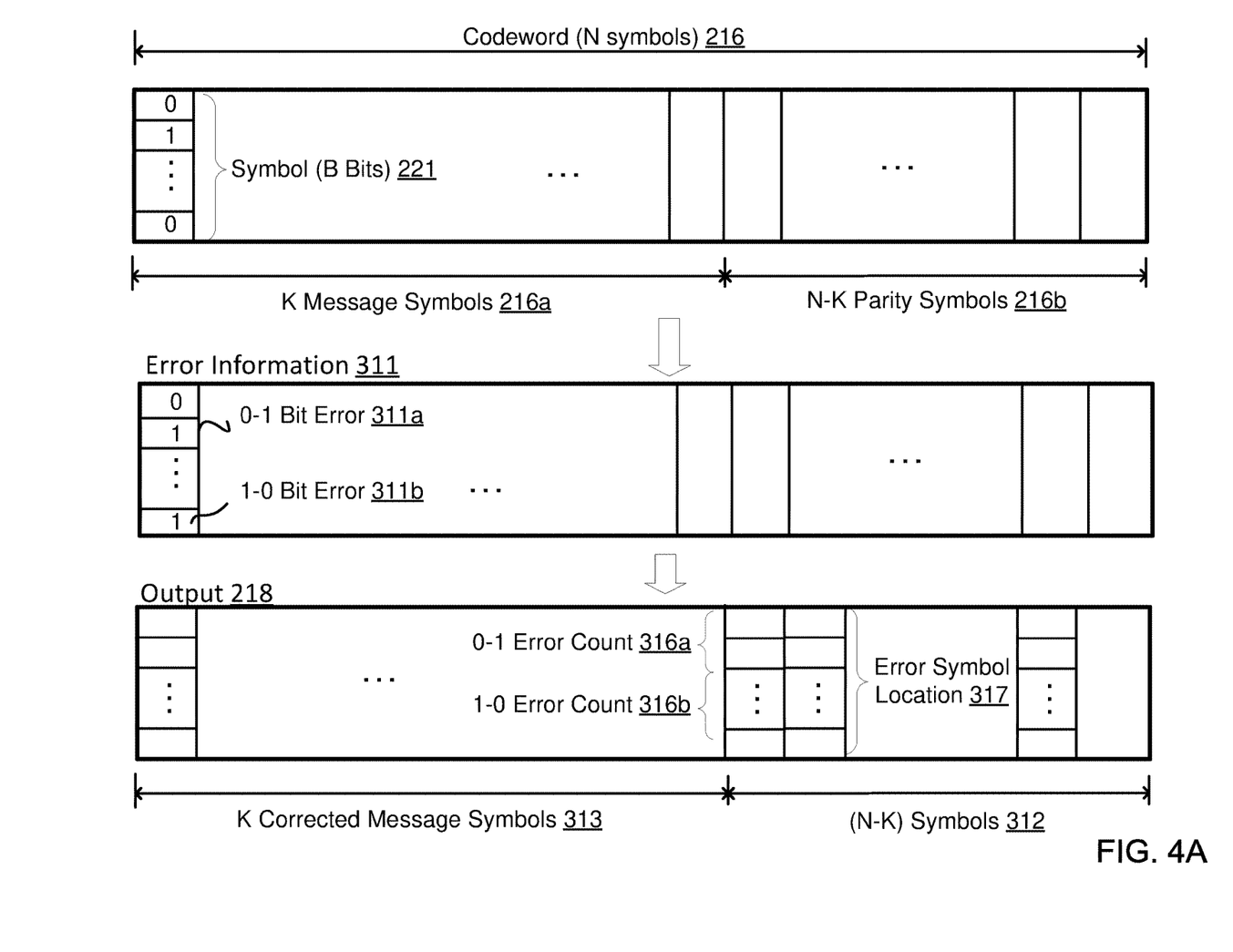
FIG. 4A is a block diagram illustrating example data structures of the codeword, the error information vector and the output vector shown in FIG. 3, according to some embodiments of the present disclosure.

8 bits. The error location of the symbol error can also be represented in 8 bits, as the maximum number of symbols in an RS codeword is $2^B$. Therefore, each symbol error takes 28 bits to represent, and the whole error information 311 can be summarized in T×2B bits=T×2 symbols=(N−K) symbols, which is the same size as the parity information. In this way, the error summary vector 312 can be output in place of the parity symbols with no physical change required to the decoder interface. Details of packing the error information 311 into the error summary vector 312 are discussed in FIG. 4.

The FEC decoder 208 further includes a data delay circuit 301 that passes the input RS(N, K) codeword 216 to a correction circuit 304. The time delayed at the data delay circuit 301 is approximately the same as the computation time at the error location and evaluation circuit 302 such that the forwarded RS(N, K) codeword arrives at the correction circuit 304 at the same time with the error information 311 outputting from the error location and evaluation circuit 302. The correction circuit 304 is then configured to generate a corrected codeword based on the error information 311, e.g., when a data bit at a certain bit location in the error information is "1," the data bit at the same bit location in the codeword is reversed. The correction circuit 304 may then discard the parity symbols and output K corrected message symbols 313 to the output element 306.

The output element 306 may be a combination circuit that generates an output codeword 218 based on error summary vector 312 and the corrected message symbols 313. In an example, a multiplexer that multiplexes the error summary vector 312 and the corrected message symbols 313 to produce an output codeword 218 that contains both the decoded message symbols and summarized error information, and has a size no greater than N symbols, as further discussed in relation to FIG. 4. In this way, the output bandwidth of the decoder 208 does not exceed the input bandwidth of the decoder.

FIG. 4 is a block diagram illustrating example data structures of the codeword 216, the error information vector 311 and the output vector 218 shown in FIG. 3, according to some embodiments of the present disclosure. As shown in FIG. 4, the input codeword 216 has a number of N symbols, e.g., K message symbols 216a and N−K) parity symbols 216b. Each symbol, e.g., shown at symbol 221, has the same size of B bits.

The error information vector 311 has the same size as the input codeword 216, with N×B data bits. Specifically, when the value of a bit location (e.g., $2^{nd}$ bit) in the error information vector 311 is "1," and the bit value at the same bit location (e.g., $2^{nd}$ bit) in the original codeword 216 is "1," a 0-to-1 bit error is detected, e.g., shown at 311a. When the value of a bit location (e.g., last bit) in the error information vector 311 is "1," and the bit value at the same bit location (e.g., last bit) in the original codeword 216 is "0," a 1-to-0 bit error is detected, e.g., shown at 311b.

The error information vector 311 is condensed and represented by a summary vector 312 having at most (N−K) symbols, summarizing at most (N−K)/2 symbol errors. Each symbol error takes 2 symbols to represent. Specifically, a bit pattern is used to count bit errors in an errored symbol. In some embodiments, the number of bits that were changed from 0 to 1 or from 1 to 0 is counted separately, which may be done by comparing the corresponding symbols from the error vector 311 and the corrected codeword. Thus, for each symbol that is in error, the number (e.g., 1) of bits changed from 0 to 1 in the symbol is counted, and the number is encoded into a binary number 316a (e.g., "1" or "00001"). The number of bits (e.g., 3) changed from 1 to 0 in the errored symbol is also counted, and the number is encoded into a binary number 316b (e.g., "11" or "00011"). In some embodiments, the bit sizes of both the binary representations 316a and 316b may be set to be $\lceil \log_2 B \rceil$. In some embodiments, the bit sizes of the binary representations 316a and 316b may be set to be B/2 (which is generally greater than $\lceil \log_2 B \rceil$) as described below. The binary numbers 316a and 316b are then concatenated to be packed into a B-bit symbol (with padding bits if necessary) representing the error value of the respective symbol error. The symbol location 317 of the errored symbol is also represented by a B-bit error location. Thus, for each symbol error, a total of 2B bits (e.g., 2 symbol size) are used to represent the error value (e.g., 0-1 error count 316a and 1-0 error count 316b) and the error symbol location 317. For example, if B=10, the 20-bit "0011 0010 00 0000001111" represents 0011=3 0-1 bit error count, 0010=2 1-0 bit error count (with "00" padding bits) in the "0000001111"=$15^{th}$ symbol.

In various embodiments, the 0-1 error count 316a and 1-0 error count 316b may be represented into a B-bit symbol for codewords. The bit counts 316a and 316b is capped by $\lceil \log_2 B \rceil$ bits each. Thus the concatenated bit counts 316a and 316b require at most $2\lceil \log_2 B \rceil$ bits, which is usually less than or equal to B for all integers except B=3 and 5. B=3 or 5, however, is rarely used as the symbol size in an RS codeword. For example, the most commonly used symbol size for RS codewords are B=8, 10 or 12. When B=10, each error count 316z or 316b requires at most 4 bits and the concatenated two counts require at most 8 bits, which is less than B=10. Thus, a 10-bit symbol is sufficient to represent the bit error counts 316a and 316b.

Therefore, the output vector 218 includes K corrected message symbols 313, followed by N−K symbols 312 summarizing at most (N−K)/2 symbol errors from the input codeword 216, as each errored symbol in the original codeword 216 requires two symbol size to summarize as described above.

In some embodiment, the generated error summary vector of (N−K) symbols 312 may be sent to an error rate computation monitor module in the receiver system. The error rate computation monitor module is configured to generate an error rate of the incoming data symbols such that the receiver 200 may provide feedback to the transmitter for network analysis. For example, when the computed error rate is high, such information may be provided to the transmitter, which may prompt the transmitter to modify its retransmission scheme.

Figure 4B:
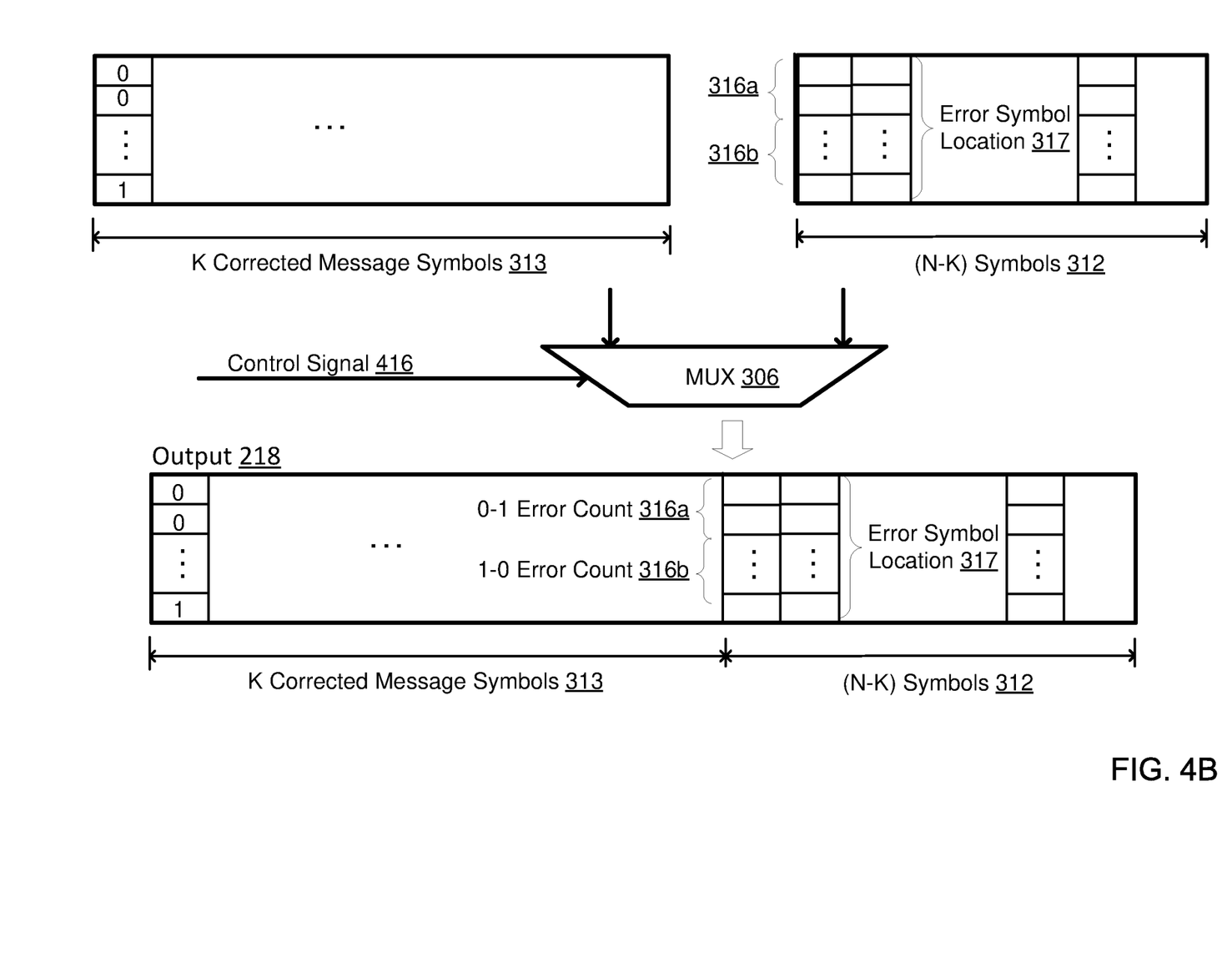
FIG. 4B is a block diagram illustrating an example output element that multiplexes the corrected information symbol vector and the summary error vector to generate an output vector of the FED decoder, according to some embodiments of the present disclosure.

FIG. 4B is a block diagram illustrating an example output element 306 that multiplexes the corrected information symbol vector 313 and the summary error vector 312 to generate an output vector 218 of the FEC decoder 208, according to some embodiments of the present disclosure. In some embodiments, the output control element 306 shown in FIG. 3 may be a multiplexer (shown at 306 in FIG. 4B), which multiplexes the vector of K corrected message symbols 313 and the error vector of (N−K) symbols 312 to generate the output 218. Specifically, a control signal 416 that is programmed to control the multiplexer 306 to select the input end connected to the correction module 304 for K symbol periods, and subsequently to select the input end connected to the error vector packing module 303 for (N−K) symbol periods.

Figure 5:
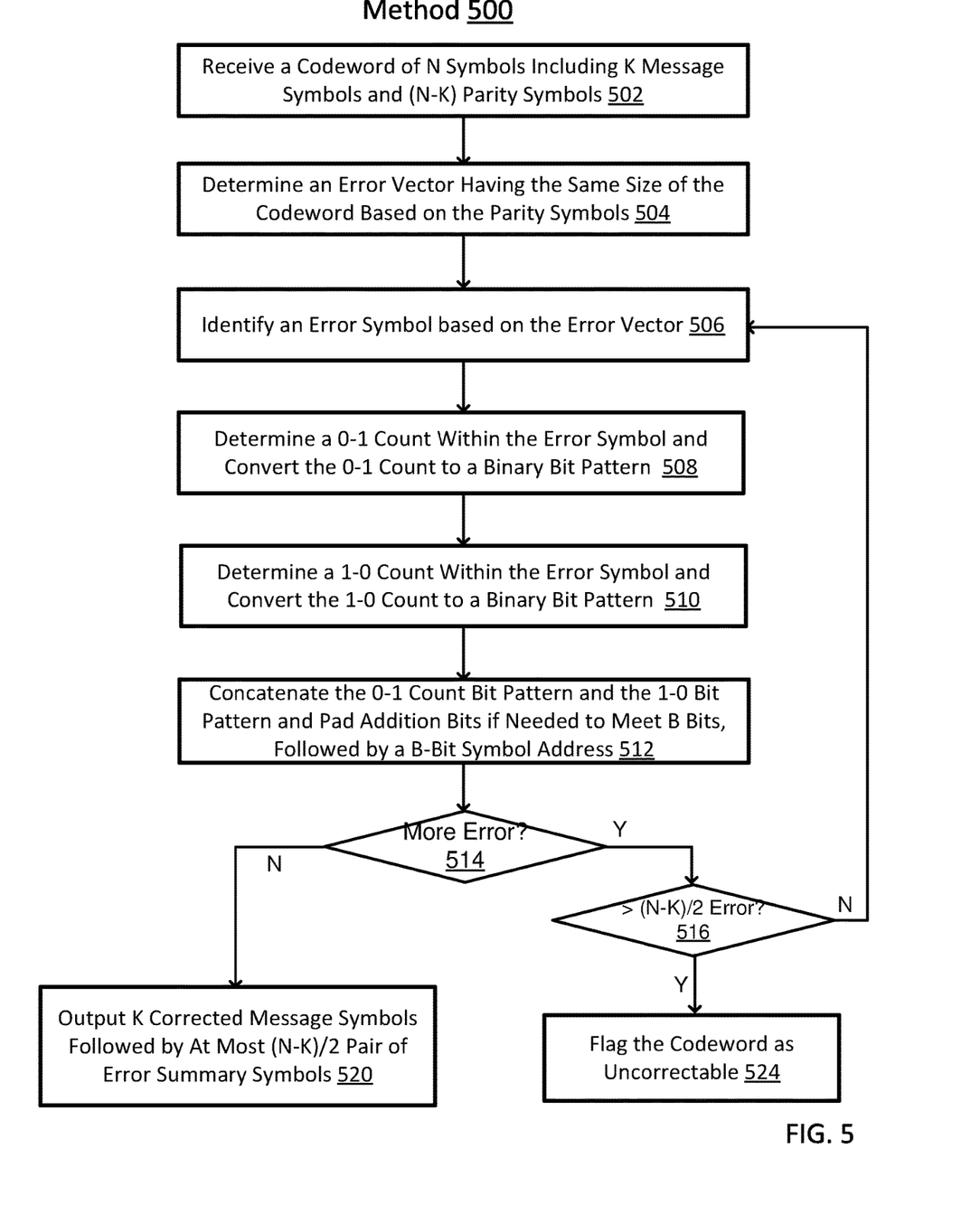
FIG. 5 is a logic flow diagram illustrating a method 500 of operating the FEC decoder to generate an output vector including both the corrected message symbols and error summaries, according to some embodiments of the present disclosure.

FIG. 5 is a logic flow diagram illustrating a method 500 of operating the FEC decoder 208 to generate an output vector 218 including both the corrected message symbols 313 and error summaries 312, according to some embodiments of the present disclosure. Method 500 may start at process 502, at which a codeword of N symbols (e.g., 216 in FIG. 4) is received at the decoder, including K message symbols (e.g., 216a in FIG. 4) and (N−K) parity symbols (e.g., 216b in FIG. 4).

At process 504, an error information vector (e.g., 311 in FIG. 4) having the same size of the received codeword (e.g., 216 in FIG. 4) is determined based on the parity symbols (e.g., 216b in FIG. 4). For example, the error location and evaluation circuit 302 computes the error information vector based on the parity information.

At process 506, an error symbol is identified based on the error vector. For example, a data bit of "1" in the error vector indicates that the corresponding symbol where the data bit is located is errored.

At process 508, within the identified error symbol, the 0-1 error count is determined and the 0-1 error count is converted into a binary bit pattern (e.g., 316a in FIG. 4).

At process 510, within the identified error symbol, the 1-0 error count is determined and converted into a binary bit pattern (e.g., 316b in FIG. 4).

At process 512, a symbol is generated based on the 0-1 error count bit pattern and the 1-0 error count bit pattern. In an example, the 0-1 error count bit pattern and the 1-0 error count bit pattern are concatenated into a B-bit symbol (with padding bits if necessary to meet B bits). In some embodiments, the 0-1 error count bit pattern and the 1-0 error count bit pattern may be interleaved or combined in any pre-defined pattern. For example, the padding bits may be added at the beginning or the end of the B-bit symbol, or may be interleaved with the 0-1 error count bit pattern and the 1-0 error count bit pattern in a pre-defined pattern. The B-bit error value is followed by a B-bit symbol address (e.g., 317 in FIG. 4).

At process 514, method 500 determines whether there are more error symbols as indicated by the error vector. If more errored symbols are to be processed, method 500 determines whether the number of errored symbols has exceeded the maximum of (N−K)/2 errors at process 516. If the number of errored symbols does not exceed (N−K)/2, method 500 proceeds to process 506 to process the next error symbol. If the number of errored symbols exceeds (N−K)/2, the codeword is flagged as uncorrectable at process 524. At process 514, when no more error symbols are left, an output vector (e.g., 218 in FIG. 4) is outputted from the decoder, including K corrected message symbols (e.g., 313 in FIG. 4) followed by at most (N−K)/2 pairs of error summary symbols (e.g., 312 in FIG. 4). In this way, output vector has a size less than or equal to the input codeword to the decoder, without requiring additional bandwidth at the output end of the decoder.

It is noted that various configurations illustrated in FIGS. 1-5 are exemplary only and not intended to be limiting beyond what is specifically recited in the claims that follow. It will be understood by those skilled in that art that other configurations may be used. One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage devices. The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A circuit comprising:
an error vector packing circuit configured to:
obtain error information indicative of at least one error symbol in a received codeword that includes a set of parity symbols; and
generate a summary vector of the error information including an error value and an error location relating to the at least one error symbol, wherein generating the summary vector includes packing the error value from the error information in a first bit pattern having the same size of the message symbol or the parity symbol, the packing including to:
count, based on the error information, a first number of bits in the at least one error symbol that changed from 0 to 1;
encode the first number into a first binary number;
count, based on the error information, a second number of bits in the at least one error symbol that changed from 1 to 0;
encode the second number into a second binary number; and
concatenate the first binary number and the second binary number into a concatenated number; and
an output element configured to output the summary vector having a size equal to or less than a total size of the set of parity symbols for generating a decoded codeword corresponding to the received codeword.

2. The circuit of claim 1, further comprising:
an error determination circuit configured to:
receive the codeword that is an error correction block code having a first block of a set of message symbols and a second block of the set of parity symbols, and
determine the error information indicative of the at least one error symbol.

3. The circuit of claim 2, wherein the error determination circuit is configured to determine error information indicative of at least one symbol error in the received codeword based on the set of parity symbols by:
generating an error vector of a bit pattern having a same size with the received codeword, wherein the error vector, when XORed with the received codeword, produces the corrected codeword.

4. The circuit of claim 1, wherein the error vector packing circuit is further configured to generate the summary vector of the error information by
packing an error location from the error information in a second bit pattern having the same size of the parity symbol.

5. The circuit of claim 4, wherein the error vector packing circuit is configured to pack the error location from the error information in the second bit pattern having the same size of the message symbol or the parity symbol by:
designating the second bit pattern indicative of a position of the at least one error symbol in the codeword.

6. The circuit of claim 4, wherein the error vector packing circuit is configured to generate the summary vector of the error information by:
concatenating the first bit pattern and the second bit pattern to form a first error block relating to the at least one error symbol.

7. The circuit of claim 6, wherein the error vector packing circuit is further configured to:
in response to determining that the error information is indicative of another error symbol in the received codeword, generate a second error block indicative of another error value and another error location relating to the another error symbol; and
concatenate the first error block and the second error block to form the summary vector.

8. The circuit of claim 1, wherein the error vector packing circuit is further configured to pack the error value from the error information in the first bit pattern having the same size of the message symbol or the parity symbol by
padding the concatenated number with extra bits to the first bit pattern having the same size of the message symbol or the parity symbol.

9. The circuit of claim 1, further comprising:
a correction circuit configured to generate a corrected codeword by:
performing an XOR operation on the error information and the received codeword, and
sending a set of corrected message symbols from the corrected codeword to the output element,
wherein the output element includes a multiplexer configured to multiplex the set of corrected message symbols and the summary vector for output, wherein the output from the multiplexer has an output throughput no greater than an input throughput for receiving the codeword.

10. The circuit of claim 1, further comprising:
an alignment circuit coupled to a plurality of parallel receiver circuits,
wherein each receiver circuit is configured to receive data from a communication link, and the alignment circuit is configured to align a plurality of codewords received from multiple communication links into one bitstream and send the one bitstream to the error vector packing circuit.

11. A method comprising:
obtaining, at an error vector packing circuit, error information indicative of at least one error symbol in a received codeword that includes a set of parity symbols;
generating a summary vector of the error information including an error value and an error location relating to the at least one error symbol, including packing the error value from the error information in a first bit pattern having the same size of the message symbol or the parity symbol, by:
counting, based on the error information, a first number of bits in the at least one error symbol that changed from 0 to 1;
encoding the first number into a first binary number;
counting, based on the error information, a second number of bits in the at least one error symbol that changed from 1 to 0;
encoding the second number into a second binary number; and
concatenating the first binary number and the second binary number; and
outputting, at an output element, the summary vector having a size equal to or less than a total size of the set of parity symbols for generating a decoded codeword corresponding to the received codeword.

12. The method of claim 11, further comprising:
receiving, at an error determination circuit, the codeword that is an error correction block code having a first block of a set of message symbols and a second block of the set of parity symbols; and
determining the error information indicative of the at least one error symbol.

13. The method of claim 12, wherein the determining error information indicative of at least one symbol error in the received codeword based on the set of parity symbols comprises:
generating an error vector of a bit pattern having a same size with the received codeword,
wherein the error vector, when XORed with the received codeword, produces the corrected codeword.

14. The method of claim 11, wherein the generating the summary vector of the error information further comprises
packing an error location from the error information in a second bit pattern having the same size of the parity symbol.

15. The method of claim 11, wherein the packing the error value from the error information in the first bit pattern having the same size of the message symbol or the parity symbol further comprises
padding the concatenated number with extra bits to the first bit pattern having the same size of the message symbol or the parity symbol.

16. The method of claim 14, wherein the packing the error location from the error information in the second bit pattern having the same size of the message symbol or the parity symbol comprises:
designating the second bit pattern indicative of a position of the at least one error symbol in the codeword.

17. The method of claim 14, wherein the generating the summary vector of the error information comprises:
concatenating the first bit pattern and the second bit pattern to form a first error block relating to the at least one error symbol.

18. The method of claim 17, further comprising:
in response to determining that the error information is indicative of another error symbol in the received codeword, generating a second error block indicative of another error value and another error location relating to the another error symbol; and
concatenating the first error block and the second error block to form the summary vector.

19. The method of claim 11, further comprising:
performing, at a correction circuit, an XOR operation on the error information and the received codeword, and
sending a set of corrected message symbols from the corrected codeword to the output element,
wherein the output element includes a multiplexer configured to multiplex the set of corrected message symbols and the summary vector for output, wherein the output from the multiplexer has an output throughput no greater than an input throughput for receiving the codeword.

20. The method of claim 11, further comprising:
aligning, at an alignment circuit coupled to a plurality of parallel receiver circuits, a plurality of codewords received from multiple communication links into one bitstream; and
sending the one bitstream to the error vector packing circuit.

\* \* \* \* \*